United States Patent

Gaylor

[15] 3,659,164

[45] Apr. 25, 1972

[54] INTERNAL CONSTRUCTION FOR PLASTIC SEMICONDUCTOR PACKAGES

[72] Inventor: John Wallen Gaylor, Princeton, N.J.

[73] Assignee: RCA Corporation

[22] Filed: Nov. 23, 1970

[21] Appl. No.: 91,716

[52] U.S. Cl.....................317/234 R, 317/234 A, 317/234 E, 317/234 F, 317/234 G, 317/234 M, 317/234 N

[51] Int. Cl...........................................H01l 3/00, H01l 5/00

[58] Field of Search......................317/234, 235, 1, 3, 3.1, 4, 317/4.1, 5, 5.4, 5.3

[56] References Cited

UNITED STATES PATENTS

| | | | |
|---|---|---|---|
| 3,278,813 | 10/1966 | Fahey | 317/234 |
| 3,292,050 | 12/1966 | Grossoehme | 317/234 |
| 3,340,602 | 9/1967 | Hontz | 317/234 |
| 3,469,148 | 9/1969 | Lund | 317/234 |
| 3,478,420 | 11/1969 | Grimes et al. | 317/234 |
| 3,496,427 | 2/1970 | Lee | 317/234 |
| 3,560,808 | 2/1971 | Segerson | 317/235 |
| 3,577,633 | 5/1971 | Homma | 317/234 |

*Primary Examiner*—John W. Huckert
*Assistant Examiner*—Andrew J. James
*Attorney*—G. H. Bruestle

[57] ABSTRACT

The package includes a substrate having a semiconductor pellet mounted on a surface thereof, with a flexible encapsulant disposed over the pellet. A spacing member is interposed between the pellet and the encapsulant. A plastic molding overlies the surface and the encapsulant, and a rim extends from the surface into the interface between the encapsulant and the molding. A metal clip extends through the molding, the rim and the encapsulant and has an end which extends through the spacing member to contact the pellet.

7 Claims, 4 Drawing Figures

INVENTOR
John W. Gaylord

BY H. L. Allen

ATTORNEY

INTERNAL CONSTRUCTION FOR PLASTIC SEMICONDUCTOR PACKAGES

BACKGROUND OF THE INVENTION

The present invention relates to semiconductor devices, and in particular, relates to plastic packages for such devices.

One of the plastic packages which is widely employed in the semiconductor industry utilizes a thermally conductive metal substrate having a semiconductor pellet mounted on a surface thereof, with a flexible encapsulant, such as a silicone resin, disposed over the pellet. A hard plastic molding surrounds the encapsulant and the surface of the substrate. Metal clips extend through the plastic and the encapsulant and make contact between the pellet and points external to the package. This plastic package has proven especially useful for power devices, since the pellet is mounted on the thermally conductive substrate which is, in turn, mounted on a heat sink.

There are, however, several disadvantages associated with this package. First, the flexible encapsulant often contains contaminants which cause surface states on the semiconductor pellet and lead to voltage and current leakage degradation. Second, since neither the molding nor the flexible encapsulant form a true hermetic seal with the substrate, deleterious liquids often permeate the package and degrade or destroy the device. Third, the metal clips move internally because of slight external mechanical stresses, since the clips are held in place only by the plastic and the encapsulant.

SUMMARY OF THE INVENTION

The present invention comprises a semiconductor device package having a substrate with a semiconductor pellet mounted on a major surface thereof. A flexible encapsulant is disposed over the pellet and spacing means are interposed between the pellet and the encapsulant. An insulating molding overlies the surface of the substrate and surrounds the encapsulant.

The invention also includes a method for making a semiconductor device package of a type having a substrate with a semiconductor pellet mounted on the surface thereof; this method comprises the following steps. Means are provided for restricting the lateral flow of a liquid encapsulant which is to be disposed over the semiconductor pellet. Additional means are provided for spacing the encapsulant from the pellet, and the liquid encapsulant is disposed over this spacing means and within the restricting means. The encapsulant is then gelled, and an insulating molding is disposed around the encapsulant and the restricting means and over the surface of the substrate.

THE DRAWING

DETAILED DESCRIPTION

Figure 1:
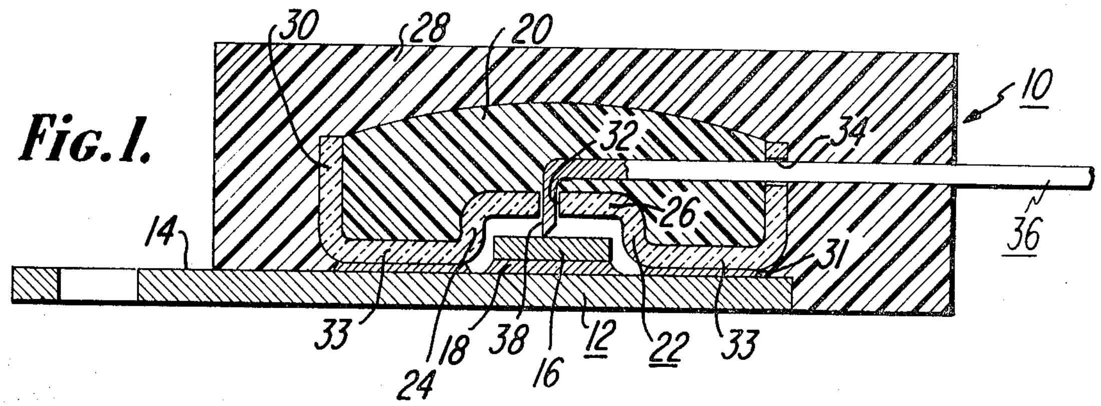
FIG. 1 is a cross-section of a semiconductor package according to the present invention.

A semiconductor package in accordance with the present invention will be described with reference to FIG. 1.

The package, referred to generally as 10, includes a substrate 12 having a major surface 14. The substrate 12 may be a metal of good thermal conductivity; for example, nickel-plated copper is suitable. The dimensions of this substrate 12 are not critical.

A semiconductor pellet 16, such as a diode, transistor, thyristor, integrated circuit or the like, is mounted on the surface 14 by means of a solder joint 18. A flexible encapsulant 20, e.g., such as a silicone resin, is disposed over the pellet 16 and is spaced apart from the pellet by a spacing member 22, which is interposed between the pellet 16 and the encapsulant 20. The spacing member 22 includes a side wall 24 which surrounds the pellet 16, and a cover 26 over the pellet which is integrally joined to the side wall. The spacing member 22 may comprise an insulating material, which preferably has a coefficient of thermal expansion closely matching that of the semiconductor pellet 16. For example, when the pellet 16 comprises silicon, a spacing member 22 of beryllia, glass, or alumina is suitable. Alternatively, the spacing member 22 may comprise a metal having insulated apertures which isolate the clip lead, described below.

A hard plastic molding 28 overlies the exposed portions of the surface 14 and surrounds the encapsulant 20. The molding 28 may comprise any of the standard plastics presently used in the semiconductor industry.

The package 10 also includes a rim 30 which extends away from the surface 14 and into the interface between the encapsulant 20 and the plastic molding 28. As shown in FIG. 1, the rim 30 may be integrally joined to the spacing member 22 by means of an extension member 33 between the rim and the spacing member. The extension member 33 closely surrounds the pellet 16 and is joined to the surface 14 by an adhesive layer 31.

The cover 26 of the spacing member 22 has an aperture 32 therethrough; further, the rim 30 has an aperture 34 which extends through the rim parallel to the substrate 12. A metal clip 36 extends substantially parallel to the surface 14 and through the molding 28, the aperture 34 of the rim 30, and the encapsulant 20. The clip 36 has an end portion 38 which extends through the aperture 32 of the cover 26 and contacts the semiconductor pellet 16.

The package 10 is made in the following manner. The pellet 16 is joined to the surface 14 of the substrate 12 by standard soldering techniques. Alternatively, the pellet 16 and a solder preform may be jigged within the extension member 33 and under the spacing member 22, which serve as means for locating the pellet during a heating step. The spacing member 22, the extension member 33, and the rim 30 may be stamped or coined from a single piece of material, as is shown in FIG. 1. The metal clip 36 is then jigged into place with the end portion 38 resting on the pellet 16. Suitably, a solder bump (not shown) is disposed on the pellet to facilitate joining the end portion 38 to the pellet 16. Subsequent heating and cooling steps join the pellet 16 and the composite extension-spacing member 33, 22 and rim 30 to the surface 14, and the end portion 38 to the pellet 16. The encapsulant 20, in liquid form, is then disposed over the spacing member 22 and within the confines of the rim 30, as from an automatic dispensing apparatus. The encapsulant 20 is then gelled to the flexible state. By way of example, the encapsulant 20 may comprise a two-part system of silane and vinyl silicone, sold by Dow Corning Corporation under the designation XR60095. This silicone gells at 150° C. The package 10 is then jigged into any one of the commercially available molding machines and the plastic molding 28 is disposed around the encapsulant 20 and the rim 30, and over the exposed portions of the surface 14. For example, the plastic molding 28 may comprise a silicone resin such as Dow Corning Corporation DC 306, which requires a ram pressure of 800 p.s.i. and a 3.0 minute cure at 350° F.

The package of the present invention offers several advantages. The spacing member effectively prevents the contaminants in the encapsulant from degrading the device, and together with the extension member provides means for locating the semiconductor pellet during fabrication. The spacing member also forms a barrier at both the molding-substrate and encapsulant-substrate interfaces, preventing the permeation of deleterious liquids. The package also provides additional mechanical strain relief for the metal clip. The rim restricts the lateral flow of the flexible encapsulant during fabrication of the package. Further, the package is useful for applications requiring two or more pellets to be employed in the same package, as described below.

Figure 2:
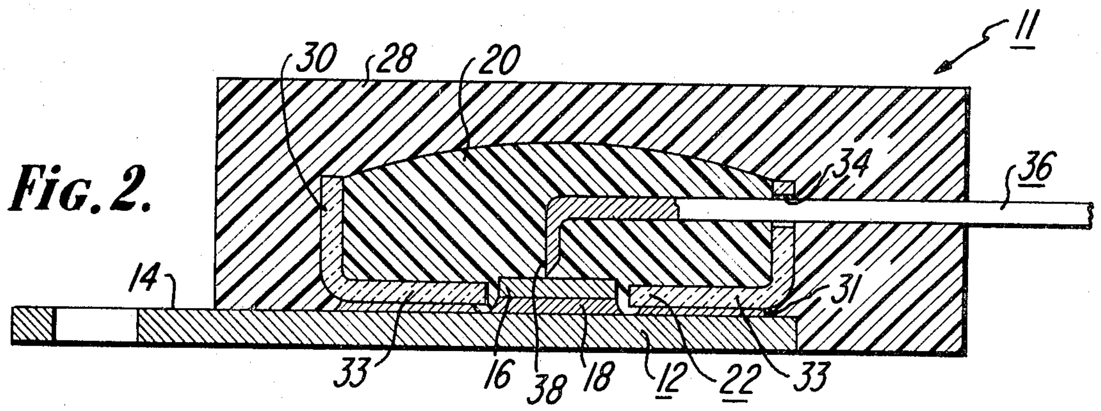
FIGS. 2–4 are cross-sections of alternate embodiments of the package of FIG. 1.

An alternate embodiment 11 of the package is shown in FIG. 2. The package 11 is similar to the package 10 of FIG. 1, except that the spacing member 22, including the side wall 24 and cover 26, is omitted. This embodiment is useful for providing means for locating the pellet during fabrication of the package.

Figure 3:
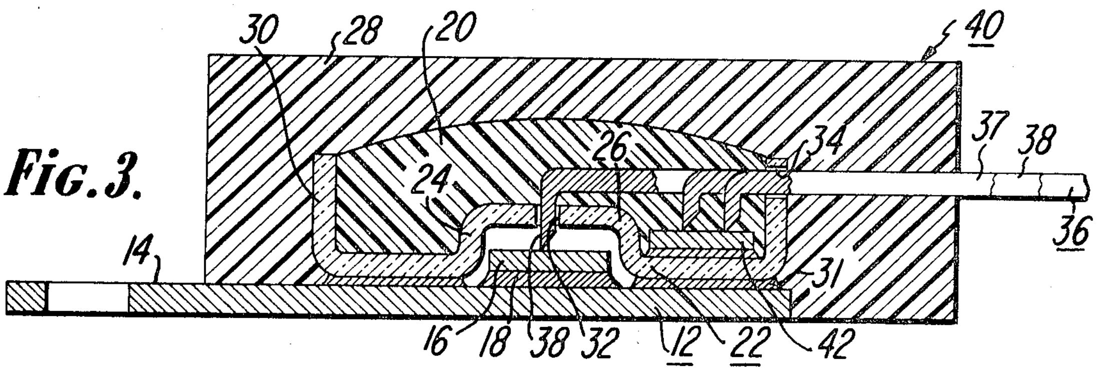

A third embodiment 40 of the package is shown in FIG. 3. This embodiment is essentially the same as the package 10 of FIG. 1, except that the package 40 includes an additional semiconductor pellet 42 joined to the upper surface of the extension member 33 between the rim 30 and the side wall 24. Two additional metal clips 37 and 38 extend through the package 40 to contact the second pellet 42 in the same manner as the clip 36 contacts the first pellet 16. This embodiment is useful for applications requiring two or more pellets which are electrically isolated from each other.

Figure 4:
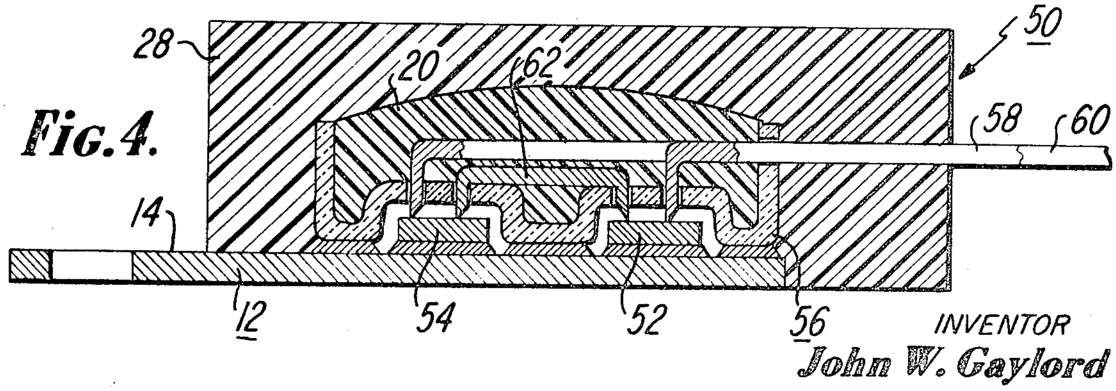

A fourth embodiment 50 of the package is shown in FIG. 4. The package 50 is similar to the package 10 of FIG. 1, except that the package 50 has two semiconductor pellets 52 and 54 bonded to the upper surface 14 of the substrate 12. A spacing member 56 is spaced between both pellets 52, 54 and the encapsulant 20 in the same manner as the spacing member 22 in FIG. 1. Metal clips 58 and 60 contact the pellets 52 and 54, respectively, and a metal interconnect 62 is carried by the spacing member 56 and electrically connects one semiconductor region of the first pellet 52 to a semiconductor region of the second pellet 54. The package 50 is useful for single package combinations of one or more devices, as a Darlington circuit, for example.

In order to make the package less expensively, the flexible encapsulant may be omitted in each of the above-described embodiments.

I claim:

1. A semiconductor package comprising:
a substrate having a major surface;
a semiconductor pellet mounted on said surface;
a flexible encapsulant disposed in spaced relation with said pellet;
spacing means joined to said substrate and interposed between said pellet and said encapsulant, said spacing means including integral means for retaining said flexible encapsulant in spaced relation with said pellet; and
an insulating molding overlying said surface and surrounding said encapsulant.

2. A semiconductor device package according to claim 1, wherein said spacing means comprises a spacing member having a side wall joined to, and extending away from said surface around said pellet, and a cover over said pellet integrally joined to said side wall.

3. A semiconductor device package according to claim 2, wherein said integral retaining means comprises a rim joined to and extending away from said surface, said rim being joined to and spaced apart from said side wall and extending into the interface between said encapsulant and said insulating molding.

4. A semiconductor device package according to claim 3, wherein said encapsulant comprises a silicone resin.

5. A semiconductor device package according to claim 4, further comprising:
said cover having an aperture therein;
a metal clip extending substantially parallel to said surface and through said molding, said rim, and said encapsulant; and
said clip having an end portion which extends through said aperture and contacts said semiconductor pellet.

6. A semiconductor device package comprising:
a metallic substrate having a major surface;
a first semiconductor pellet mounted on said surface;
an insulating member substantially parallel and joined to said surface;
a second semiconductor pellet mounted on said insulating member;
a flexible encapsulant disposed over said pellets;
spacing means interposed between said encapsulant and one of said pellets and joined to said insulating member;
an insulating molding overlying said surface and surrounding said encapsulant; and
terminal means extending into said package and contacting said pellets.

7. A semiconductor device package comprising:
a substrate having a major surface;
two semiconductor pellets mounted on said surface;
a flexible encapsulant disposed over said pellets;
a spacing member joined to said surface and interposed between said encapsulant and said pellets;
an insulating molding overlying said surface and surrounding said encapsulant;
terminal means extending into said package and contacting said pellets; and
means within said package for electrically interconnecting one of said pellets to the other pellet, said means comprising a metal clip carried by said spacing member.

* * * * *